(12) United States Patent
Cheng et al.

(10) Patent No.: US 8,415,252 B2
(45) Date of Patent: Apr. 9, 2013

(54) SELECTIVE COPPER ENCAPSULATION LAYER DEPOSITION

(75) Inventors: Tien-Jen Cheng, Hopewell Junction, NY (US); Abhishek Dube, Hopewell Junction, NY (US); Zhengwen Li, Hopewell Junction, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 624 days.

(21) Appl. No.: 12/683,857

(22) Filed: Jan. 7, 2010

(65) Prior Publication Data

US 2011/0162875 A1    Jul. 7, 2011

(51) Int. Cl.
 *H01L 21/44*   (2006.01)
(52) U.S. Cl.
 USPC .... 438/677; 438/798; 257/759; 257/E23.134; 257/E21.241; 427/97.6
(58) Field of Classification Search .................. 438/677, 438/798; 257/E21.479, E21.584, 759, E21.241, 257/E23.017, E23.134; 427/97.3, 97.6
 See application file for complete search history.

(56) References Cited

U.S. PATENT DOCUMENTS

| | | | |
|---|---|---|---|
| 5,487,792 A | 1/1996 | King et al. | |
| 6,100,184 A | 8/2000 | Zhao et al. | |
| 6,181,013 B1 | 1/2001 | Liu et al. | |
| 6,214,728 B1 | 4/2001 | Chan et al. | |
| 6,696,761 B2 | 2/2004 | Chan et al. | |
| 6,709,874 B2 | 3/2004 | Ning | |
| 6,858,527 B2 | 2/2005 | Gracias | |
| 7,208,455 B2 | 4/2007 | Gracias | |
| 2002/0121700 A1* | 9/2002 | Tallon | 257/758 |
| 2005/0093162 A1* | 5/2005 | Gracias | 257/759 |
| 2006/0249849 A1 | 11/2006 | Cohen | |
| 2008/0032109 A1* | 2/2008 | Leising et al. | 428/220 |
| 2008/0233745 A1 | 9/2008 | Chang et al. | |
| 2009/0121192 A1* | 5/2009 | Abys et al. | 252/392 |
| 2009/0304914 A1* | 12/2009 | Nalla et al. | 427/124 |

FOREIGN PATENT DOCUMENTS

WO    2004109750    * 12/2004

* cited by examiner

*Primary Examiner* — Caridad Everhart
(74) *Attorney, Agent, or Firm* — Scully, Scott, Murphy & Presser, P.C.; Joseph P. Abate, Esq.

(57) ABSTRACT

A metal interconnect structure provides high adhesive strength between copper atoms in a copper-containing structure and a self-aligned copper encapsulation layer, which is selectively deposited only on exposed copper surfaces. A lower level metal interconnect structure comprises a first dielectric material layer and a copper-containing structure embedded in a lower metallic liner. After a planarization process that forms the copper-containing structure, a material that forms Cu—S bonds with exposed surfaces of the copper-containing structure is applied to the surface of the copper-containing structure. The material is selectively deposited only on exposed Cu surfaces, thereby forming a self-aligned copper encapsulation layer, and provides a high adhesion strength to the copper surface underneath. A dielectric cap layer and an upper level metal interconnect structure can be subsequently formed on the copper encapsulation layer.

20 Claims, 5 Drawing Sheets

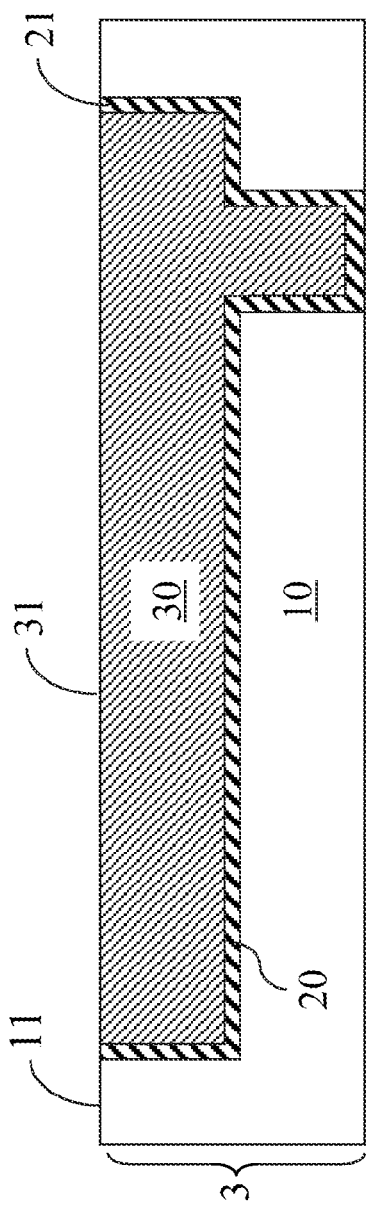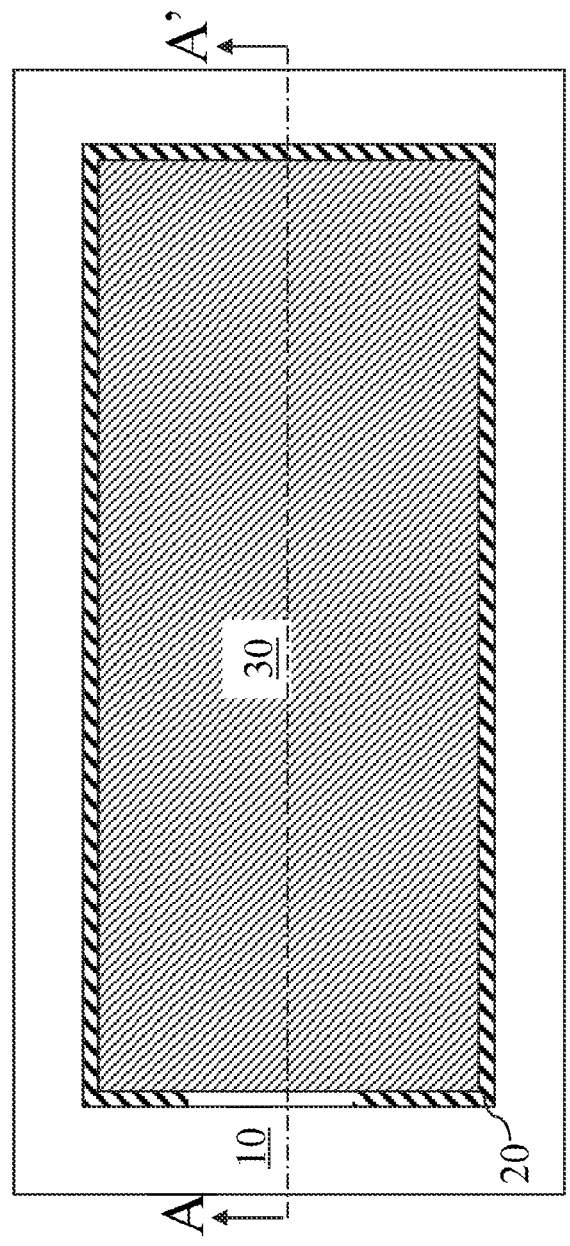
FIG. 1A
FIG. 1B

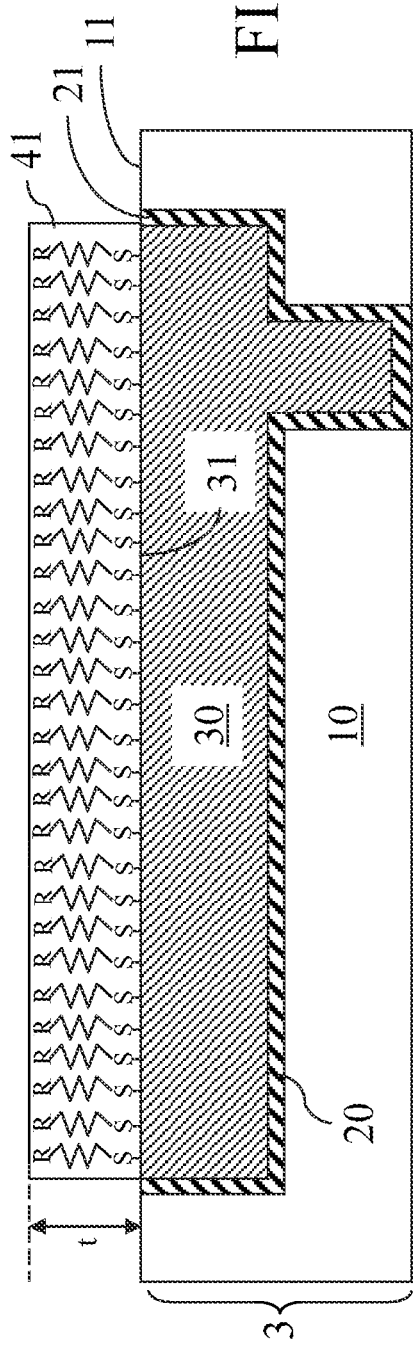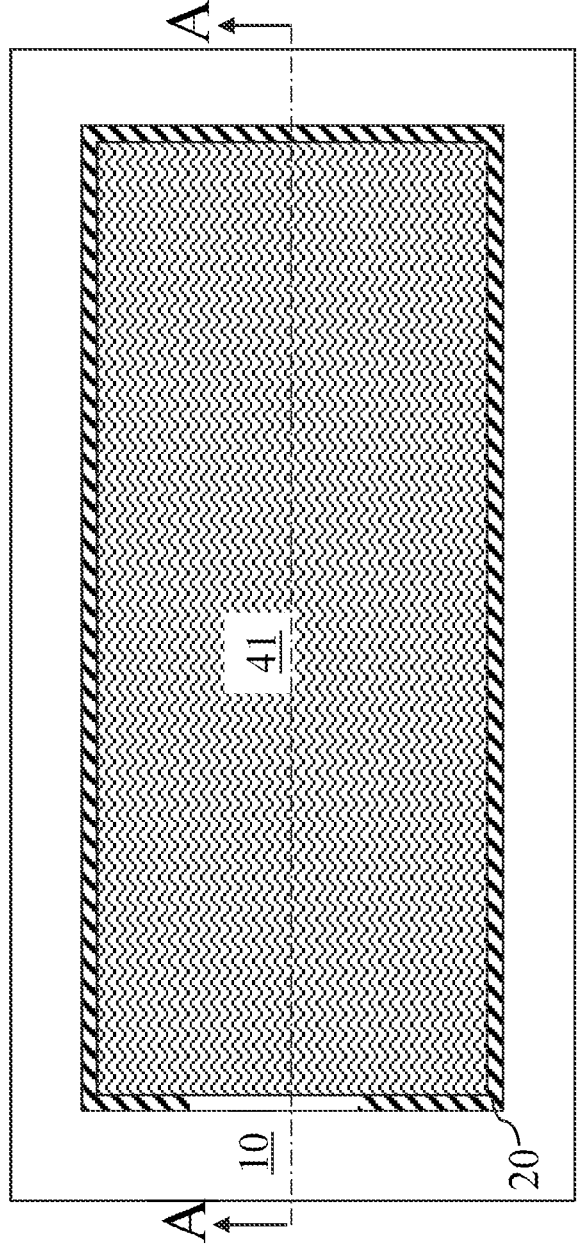

SELECTIVE COPPER ENCAPSULATION LAYER DEPOSITION

BACKGROUND

The present invention relates to a metal interconnect structure, and particularly to a metal interconnect structure including a copper-containing structure having a selectively deposited and self-aligned copper encapsulation layer thereupon and methods of manufacturing the same.

Metal interconnect structures employed in semiconductor chips employ copper-containing structures for copper-containing structures and metal vias, which include copper as a predominant composition. Exposed surfaces of such copper-containing structures tend to be oxidized in air after a planarization process such as chemical mechanical planarization (CMP). Presence of a copper oxide layer on surfaces of copper-containing structures degrades adhesion of the copper-containing structures to a dielectric cap layer deposited thereupon, thereby adversely impacting the reliability of the metal interconnect structure during operation.

Benzotriazole (BTA) can be applied to exposed copper surfaces after chemical mechanical planarization to reduce oxidation of copper. However, BTA also causes "hollow metal" problems by causing formation of microcavities on the surface of copper-containing structures, thereby aggravating the reliability of the metal interconnect structure during operation.

The reliability of a metal interconnect structure is closely related to adhesion of surfaces of a copper-containing structure to a dielectric material layer formed thereupon. The greater the adhesive strength between copper atoms in a copper-containing structure and a dielectric material formed as a cap thereupon, the greater the resistivity to electromigration of the material in the copper-containing structure when electrical current flows therethrough during the usage of a semiconductor chip containing the copper-containing structure.

BRIEF SUMMARY

The present invention provides a metal interconnect structure having high adhesive strength between copper atoms in a copper-containing structure and a self-aligned copper encapsulation layer, which is selectively deposited only on exposed copper surfaces. A lower level metal interconnect structure comprises a first dielectric material layer and a copper-containing structure embedded in a lower metallic liner. After a planarization process that forms the copper-containing structure, a material that forms Cu—S bonds with exposed surfaces of the copper-containing structure is applied to the surface of the copper-containing structure. The material is selectively deposited only on exposed Cu surfaces, thereby forming a self-aligned copper encapsulation layer and providing high adhesion strength to the copper surface underneath. A dielectric cap layer and an upper level metal interconnect structure can be subsequently formed on the copper encapsulation layer.

According to aspect of the present invention, a metal interconnect structure is provided, which includes a dielectric material layer embedding a copper-containing structure having a planar upper surface; and a monolayer of dielectric molecules forming Cu—S bond located on the planar upper surface of the copper-containing structure, wherein the monolayer of dielectric molecules is self-aligned to an area enclosed by a periphery of the planar upper surface of the copper-containing structure.

According to another aspect of the present invention, a method of manufacturing a metal interconnect structure is provided, which includes forming a copper-containing structure having a planar upper surface in an upper portion of a dielectric material layer; and applying a solution including dielectric molecules to the planar upper surface, wherein a monolayer of dielectric molecules forming Cu—S bond is formed on the planar upper surface of the copper-containing structure, and the monolayer of dielectric molecules is self-aligned to an area enclosed by a periphery of the planar upper surface of the copper-containing structure.

BRIEF DESCRIPTION OF THE SEVERAL VIEWS OF THE DRAWINGS

FIGS. 1A and 1B are views of an exemplary metal interconnect structure after formation of a copper-containing structure embedded in a first dielectric material layer according to an embodiment of the present invention. FIG. 1A is a vertical cross-sectional view along the plane A-A' in FIG. 1B. FIG. 1B is a top-down view.

FIGS. 2A and 2B are views of the exemplary metal interconnect structure after formation of a monolayer of dielectric molecules on a planar upper surface of the copper-containing structure according to an embodiment of the present invention. FIG. 2A is a vertical cross-sectional view along the plane A-A' in FIG. 2B. FIG. 2B is a top-down view.

FIG. 3A is a vertical cross-sectional view along the plane A-A' in FIG. 3B. FIG. 3B is a top-down view.

FIG. 4A is a vertical cross-sectional view along the plane A-A' in FIG. 4B. FIG. 4B is a top-down view.

DETAILED DESCRIPTION

Figure 3A:
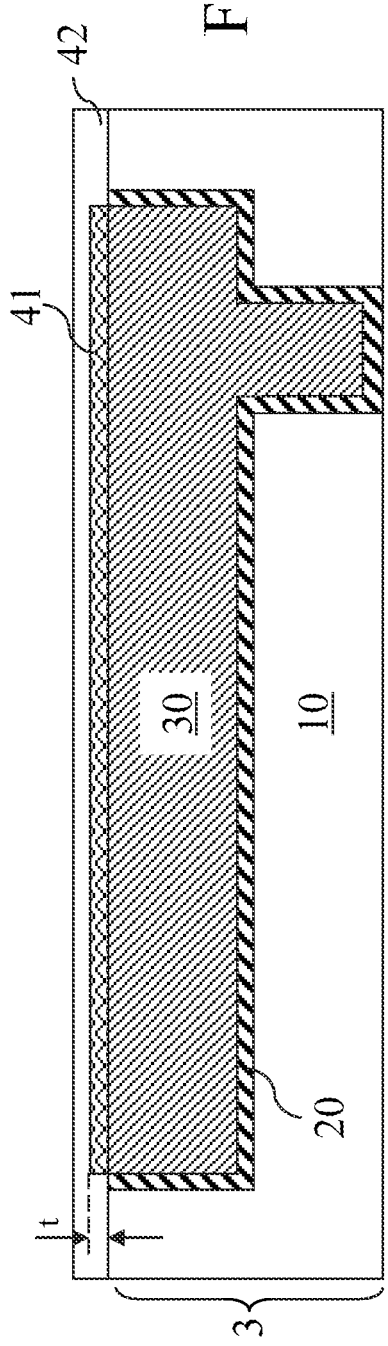
FIGS. 3A and 3B are views of the exemplary metal interconnect structure after formation of a dielectric cap layer according to an embodiment of the present invention.

As stated above, the present invention relates to a metal interconnect structure including a copper-containing structure having a selectively deposited and self-aligned copper encapsulation layer thereupon and methods of manufacturing the same, which are described herein with accompanying figures. Throughout the drawings, the same reference numerals or letters are used to designate like or equivalent elements. The drawings are not necessarily drawn to scale.

As used herein, the term "alkyl", alone or in combination with any other term, refers to a straight-chain or branch-chain saturated aliphatic hydrocarbon radical containing a number of carbon atoms from 1 to 20, preferably from 1 to 10 and more preferably from 1 to 5 carbon atoms. Examples of alkyl radicals include, but are not limited to, methyl, ethyl, n-propyl, isopropyl, n-butyl, isobutyl, sec-butyl, tert-butyl, pentyl, isoamyl, n-hexyl and the like.

As used herein, the term "aminoalkyl," alone or in combination with any other term, refers to alkyl as defined above wherein a hydrogen atom has been replaced by an amino group.

As used herein, the term "substituted alkyl," alone or in combination with any other term, refers to alkyl as defined above, wherein one or more hydrogen atom(s) is/are substituted with one or more azido, amino, halogen, hydroxy, carboxy, cyano, alkoxycarbonyl, aminocarbonyl, alkanoyloxy, alkoxy, phenyloxy, (substituted phenyl)oxy, mercapto, alkylthio, phenylthio, (substituted phenyl)thio, alkylsulfinyl, or alkylsulfonyl groups.

As used herein, a "copper-containing structure" is a conductive structure composed of elemental copper or a copper alloy having at least 50% of copper atoms in atomic percentage. The copper containing structure can consist essentially of copper or can include at least another elemental metal.

As used herein, a "metallic liner" is a liner contacting a sidewall and/or a bottom surface a copper-containing structure and comprising a metallic nitride layer and, optionally, a layer of an elemental metal or an intermetallic alloy.

As used herein, a "metal line" is a metal structure extending in a horizontal direction to provide electrical conduction in a horizontal direction.

As used herein, a metal via" is a metal structure extending in a vertical direction to provide electrical conduction in a vertical direction.

As used herein, a first surface is "substantially coplanar with" a second surface if said first surface and said second surface are offset at most by a distance within controllability of a processing step intended to make said first surface and said second surface coplanar with each other or offset by an insignificant dimension in view of dimensional changes generated by said processing step.

An element "abuts" another element when a physical interface area providing a direct contact is present between the element and the other element.

Referring to FIGS. 1A and 1B, an exemplary metal interconnect structure according to an embodiment of the present invention includes a lower level metal interconnect structure 3. The lower level metal interconnect structure 3 includes a first dielectric material layer 10 embedding a first conductive structure, which can include a first metallic liner 20 and a first copper-containing structure 30. The first metallic liner 20 is present between the first dielectric material layer 10 and the first copper-containing structure 30 to promote adhesion of the bottom surface and sidewalls of the first copper-containing structure 30 to the first dielectric material layer 10. The first dielectric material layer 10 can be formed on a substrate, which can be a semiconductor structure including at least one semiconductor device such as a field effect transistor, a bipolar transistor, or a diode.

The first dielectric material layer 10 can include an oxide based conventional dielectric material or a low-k dielectric material. The oxide based conventional dielectric material has a dielectric constant k from about 3.6 to about 3.9. The low-k dielectric material has a dielectric constant k of about 3.0 or less, preferably less than about 2.8, and more preferably less than about 2.5. Non-limiting examples of the oxide based conventional dielectric material included undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of a spin-on low-k dielectric material is a thermosetting polyarylene ether, which is also commonly referred to as "Silicon Low-K", or "SiLK™" The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the first dielectric material layer 10. The first dielectric material layer 10 can be a composite dielectric material stack that includes a stack of at least two of oxide based conventional dielectric materials, spin-on low-k dielectric materials, and CVD low-k dielectric materials. The thickness of the first dielectric material layer 10 can be from 50 nm to 5,000 nm, although lesser and greater thicknesses can also be employed.

Depending on whether a dual damascene integration scheme is employed or a single damascene integration scheme is employed to form the lower level metal interconnect structure 3, the first metallic liner 20 and the first copper-containing structure 30 may constitute a conductive structure in which a conductive metal line and at least one metal via extending downward are integrated, or may constitute only a conductive metal line without any metal via extending downward. An underlying dielectric cap layer (not shown) may be provided to retards diffusion of metal and impurity atoms between different metal interconnect levels. The underlying dielectric cap layer, if present, can include silicon nitride, silicon oxynitride, silicon carbide, silicon boride, silicon carbide nitride, or a stack thereof.

To form the first conductive structure (20, 30), recessed surfaces including at least a line trench is formed in an upper portion of the first dielectric material layer 10. The first metallic liner 20 is formed on the recessed surfaces of the first dielectric material layer 10, i.e., surfaces below the level of the top surface of the first dielectric material layer 10. The first metallic liner 20 includes a conductive metallic material, i.e., a conductive material including a metal, such as TiN, TaN, WN, or any combinations thereof. The first metallic liner 20 can be formed, for example, by physical vapor deposition (PVD), chemical vapor deposition, electroplating, electroless plating, or a combination thereof.

The first copper-containing structure 30 can be composed essentially of copper, i.e., copper with optional impurities at insignificant levels. Alternately, the first copper-containing structure 30 can be a metallic alloy of copper and at least one elemental metal in which the content of copper is greater than 50% in atomic concentration. Non-limiting examples of a metallic alloy that can be employed for the first copper-containing structure 30 include a Cu—Al alloy, Cu—Sn alloy, Cu—Ag alloy, Cu—Ag—Sn alloy. The first copper-containing structure 30 is formed directly on, and the inside of, the first metallic liner 20. The first copper-containing structure 30 can be formed, for example, by physical vapor deposition (PVD), chemical vapor deposition, electroplating, electroless plating, or a combination thereof.

Any excess copper and/or excess conductive metallic material deposited above the top surface of the first dielectric material layer 10 is removed by planarization, which can employ chemical mechanical planarization, a recess etch, or a combination thereof. After planarization, a planar upper surface 21 of the first metallic liner 20 and a planar upper surface 31 of the first copper-containing structure 30 are substantially coplanar with a planar upper surface 11 of the first dielectric material layer 10. The planar upper surfaces (11, 21, 31) of the first dielectric material layer 10, the first metallic liner 20, and the first copper-containing structure 30 are exposed after the planarization. The first dielectric material layer 10 embeds the first copper-containing structure 31 having a planar upper surface 31 thereof. The first metallic liner 20 contacts sidewalls of the first copper-containing structure 30, and the first copper-containing structure 30 is spaced from the first dielectric material layer 10 by the first metallic liner.

Referring to FIGS. 2A and 2B, a solution including dielectric molecules as a solute is prepared and applied to the planar upper surfaces (11, 21, 31) of the first dielectric material layer 10, the first metallic liner 20, and the first copper-containing structure 30. The solution includes a non-polar solvent. Preferably, the solution includes an organic solvent. For example, the solution can include pentene, hexane, heptane, isooctance, or any other non-aromatic alkenes. Typically, the solution includes pentene or hexane. The concentration of the dielectric molecules in the solution can be from 0.05% to 3%, although lesser and greater concentrations of dielectric molecules can also be employed.

The dielectric molecules include a sulfur atom at one end. Further, the dielectric molecules do not form a chemical bond with the material of the first dielectric material layer 10. Typically, the dielectric molecules do not form a chemical bond with the material of the first metallic liner 20.

Upon application of the solution including dielectric molecules to the planar upper surfaces (11, 21, 31) of the first dielectric material layer 10, the first metallic liner 20, and the first copper-containing structure 30, a monolayer 41 of dielectric molecules is formed on the planar upper surface 31 of the first copper-containing structure 30. The thickness t of the monolayer 41 of dielectric molecules depends on the length of the dielectric molecule, and can be from 1 nm to 6 nm, and typically from 1.5 nm to 5 nm, although lesser and greater thicknesses can also be employed. The vertical scale of the monolayer 41 of dielectric molecules is expanded in FIG. 2 to schematically illustrate a substantially vertical alignment of the dielectric molecules and the presence of a "monolayer," i.e., a single layer, of the dielectric molecules. All dielectric molecules in the monolayer 41 can have an identical chemical formula.

Each dielectric molecules forms a Cu—S bond with a copper atom on the planar upper surface 31 of the first copper-containing structure 30, thereby forming a monolayer 41 of dielectric molecules that are self-aligned to an area enclosed by the periphery of the planar upper surface 31 of the first copper-containing structure 30. The monolayer 41 of dielectric molecules does not contact the planar upper surface 21 of the first metallic liner 20 or the planar upper surface 11 of the first dielectric material layer 10, i.e., does not abut the first metallic liner 20 or the first dielectric material layer 10. Each dielectric molecule in the monolayer 41 of dielectric molecules is aligned substantially vertically so that one end of the dielectric molecule including the sulfur atom is a proximal end that is adjacent to the first copper-containing structure 30 and the other end of the dielectric molecule not including the sulfur atom is a distal end that points away from the first copper-containing structure 30.

A chemical formula for a first exemplary dielectric molecule that can be employed as dielectric molecules in the monolayer 41 of dielectric molecules can be:

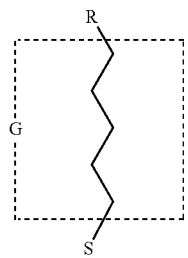

The first exemplary dielectric molecule includes a sulfur atom at one end and includes an end group R at the other end. The end group R is selected from an alkyl group, an aminoalkyl group, and a substituted alkyl group. When a Cu—S bond is formed between the sulfur atom and a copper atom of the first copper-containing structure 30 in the exemplary metal interconnect structure (See FIGS. 2A and 2B), the end group R is located at the opposite side of the Cu—S bond. The first exemplary dielectric molecule includes the sulfur atom, at least one substituted or unsubstituted —CH$_2$— group G that is bonded to the sulfur atom, and the end group R that is bonded to the at least one substituted or unsubstituted —CH$_2$— group G.

The at least one substituted or unsubstituted —CH$_2$— group G can be a single substituted or unsubstituted —CH$_2$— group. Alternately, the at least one substituted or unsubstituted —CH$_2$— group G can be a chain of n independent substituted or unsubstituted —CH$_2$— groups in which n is an integer from 2 to 22. Preferably, the at least one substituted or unsubstituted —CH$_2$— group G is a chain of n independent substituted or unsubstituted —CH$_2$— groups in which n is an integer from 8 to 18.

Each substituted or unsubstituted —CH$_2$— group among the at least one substituted or unsubstituted —CH$_2$— group G can be independently selected from —CH$_2$—, —CHX—, and —CYZ—, in which each of X, Y, and Z is an independent halide, i.e., is independently selected from F, Cl, Br, and I.

For example, the first exemplary dielectric molecule can have a formula of SH(CH$_2$)n-R in a solid phase prior to becoming a solute. Upon forming of a bond with a copper atom, the first exemplary dielectric molecule can have a formula of —S(CH$_2$)n-R in a bonded state. The number n can be a positive integer less than 23, i.e., an integer from 1 to 22.

A chemical formula for a second exemplary dielectric molecule that can be employed as dielectric molecules in the monolayer 41 of dielectric molecules can be:

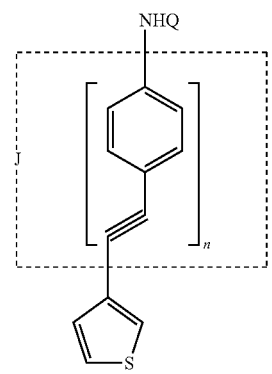

The second exemplary dielectric molecule includes a thiophene group at one end and includes an NHQ group at the other end. Q is selected from an alkyl group, an aminoalkyl group, and a substituted alkyl group. When a Cu—S bond is formed between the thiophene group and a copper atom of the first copper-containing structure 30 in the exemplary metal interconnect structure (See FIGS. 2A and 2B), the NHQ group is located at an end that is located at the opposite side of the Cu—S bond. The second exemplary dielectric molecule includes the thiophene group, at least one phenyl group J that is bonded to the thiophene group, and the NHQ group that is bonded to the at least one phenyl group J.

The at least one phenyl group J can be a single unsubstituted or substituted phenyl group. Alternately, the at least one phenyl group J can be a chain of n phenyl groups, in which each of the n phenol groups can be unsubstituted or independently substituted and n is an integer from 2 to 10. Preferably, the at least one phenyl group J is a single phenyl group or a chain of n phenyl groups, in which n is 2 or 3.

As discussed above, when applied to the planar upper surfaces of the (11, 21, 31; See FIG. 2A) of the first dielectric material layer 10, the first metallic liner 20, and the first copper-containing structure 30 as a solute in a solution, each of the first and second dielectric materials form a monolayer 41 only on the planar upper surface 31 of the first copper-containing structure 30, but does not become attached to the upper surfaces (11, 21) of the first dielectric material layer 10 and the first metallic liner 20. Upon removal of the solution, only the planar upper surface 31 of the first copper-containing structure 30 is covered with the monolayer 41 of dielectric materials, and the atoms on the upper surfaces (11, 21) of the first dielectric material layer 10 and the first metallic liner 20 are exposed to ambient. The monolayer 41 of dielectric materials on the exemplary metal interconnect structure protects the planar upper surface 31 of the first copper-containing structure 30 from oxidation after the solution is removed. Due to the strength of the Cu—S bond between the copper atoms at the planar upper surface 31 of the first copper-containing structure 30 and the monolayer 41 of dielectric molecules, the monolayer 41 of dielectric molecules stays on the first copper-containing structure indefinitely.

In one embodiment, the solution including the solvent and the dielectric material can be applied at a last processing step as in integrated step of a planarization process, which can be a chemical mechanical planarization (CMP) step. After the excess copper and/or excess conductive metallic material from above the top surface of the first dielectric material layer 10 is removed and the planar upper surfaces of the (11, 21, 31; See FIG. 2A) of the first dielectric material layer 10, the first metallic liner 20, and the first copper-containing structure 30 are formed, the solution can be applied during a rinsing step that forms the monolayer 41 of dielectric materials as illustrated in FIGS. 2A and 2B. In alternate embodiment, the solution including the solvent and the dielectric material can be applied at a separate processing step that follows a planarization process. Preferably, the time between the end of the planarization process and application of the solution is minimized to prevent formation of copper oxide on the planar upper surface 31 of the first copper-containing structure 30.

Figure 3B:
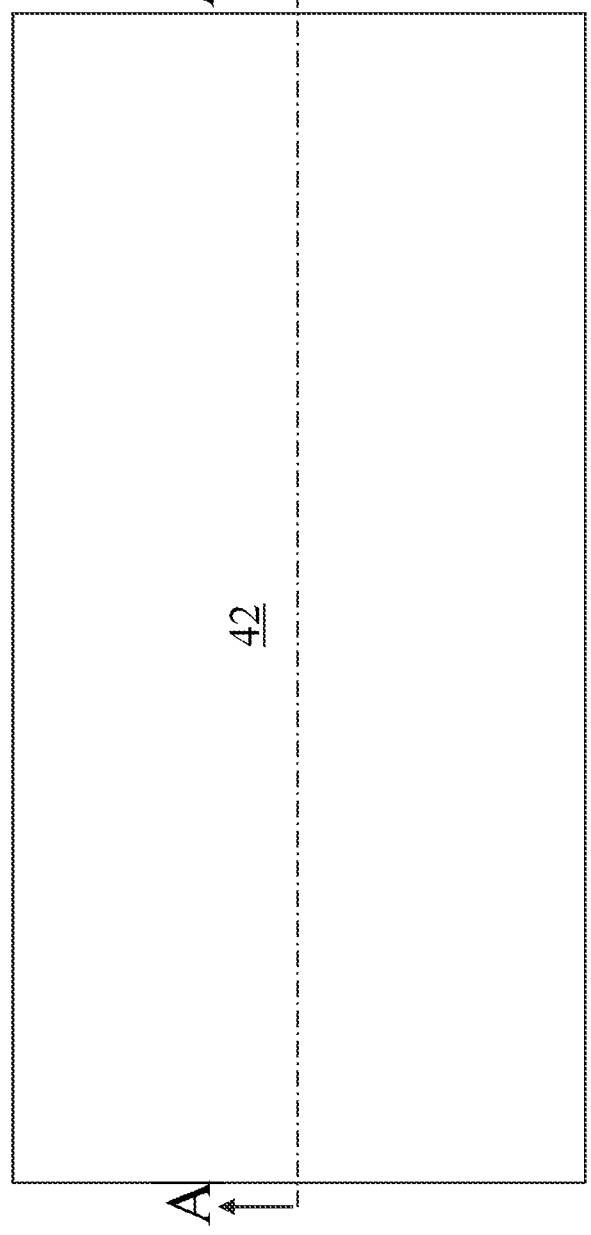

Referring to FIGS. 3A and 3B, an optional plasma treatment may be performed to on the monolayer 41 of dielectric molecules and the exposed surfaces of the first dielectric material layer 10 and the first metallic liner 20. After the plasma treatment, the dielectric molecules are cross-linked by atomic bonds between neighboring dielectric molecules within the monolayer 41 of dielectric molecules.

If employed, such a plasma treatment can be performed in-situ in a deposition chamber in which a dielectric cap layer 42 is subsequently deposited. The plasma can include ions of hydrogen, oxygen, and/or nitrogen. Furthermore, the plasma can include ions of an inert gas such as He, Ne, Ar, Xe, and Kr. If employed, the plasma treatment can remove contaminants from the exposed surfaces of the first dielectric material layer 10 and the first metallic liner 20. Further, the plasma treatment can densify the monolayer 41 of dielectric materials by causing a cross-linking of neighboring dielectric molecules.

If the first exemplary dielectric molecule is employed, the first exemplary dielectric molecule can lose a hydrogen atom or a substituting atom in any of —$CH_2$—, —CHX—, and —CYZ—, in which each of X, Y, and Z is an independent halide, within the at least one substituted or unsubstituted —$CH_2$— group G during the plasma treatment. The carbon atom that loses the hydrogen atom or the substituting atom can bond with another carbon atom of a neighboring first exemplary dielectric molecule that similarly loses a hydrogen atom or a substituting atom. Thus, the first exemplary dielectric molecules can be cross-linked and densified in the monolayer 41 of dielectric molecules during the plasma treatment.

If the second exemplary dielectric molecule is employed, the second exemplary dielectric molecule can lose a hydrogen atom or a substituting atom in any substituted or unsubstituted phenol group in the at least one phenyl group J. The carbon atom that loses the hydrogen atom or the substituting atom can bond with another carbon atom of a neighboring second exemplary dielectric molecule that similarly loses a hydrogen atom or a substituting atom. Further, the triple carbon bond between a pair of carbon atoms in each substituted or unsubstituted phenol group in the at least one phenyl group J can become a double bond or a single bond, and the two carbon atoms may then form additional bonds with carbon atoms in a neighboring second exemplary dielectric molecule within the monolayer 41 of dielectric molecules.

After the optional plasma treatment of the monolayer 41 of dielectric materials, a dielectric cap layer 42 can be deposited in a deposition chamber. A dielectric cap layer 42 can be deposited on the exposed surfaces of the monolayer 41 of dielectric materials and the planar upper surfaces of the first metallic liner 20 and the first dielectric material layer 10. The dielectric cap layer 42 can be deposited, for example, by plasma enhanced chemical vapor deposition (PECVD), high density plasma chemical vapor deposition (HDPCVD), atomic layer deposition (ALD), or low pressure chemical vapor deposition (LPCVD).

The dielectric cap layer 42 is composed of a material that blocks or retards diffusion of mobile ions, moisture, and/or metal atoms. The dielectric cap layer 42 can include silicon nitride, silicon oxynitride, silicon carbide, silicon boride, silicon carbon boride, silicon carbide nitride, a low-k CVD dielectric material, which is the dielectric constant of silicon oxide, or a stack thereof. The low-k CVD dielectric material is includes Si, C, O, H, and optionally N, has a dielectric constant less than 3.9, and can be formed by chemical vapor deposition (CVD). Preferably, the low-k CVD dielectric material includes Si, C, O, H, and N. The low-k CVD dielectric material can be, for example, Blok™ or NBLok™. The thickness of the dielectric cap layer 42 can be from 5 nm to 80 nm, and typically from 10 nm to 30 nm, although lesser and greater thicknesses can also be employed.

Figure 4A:
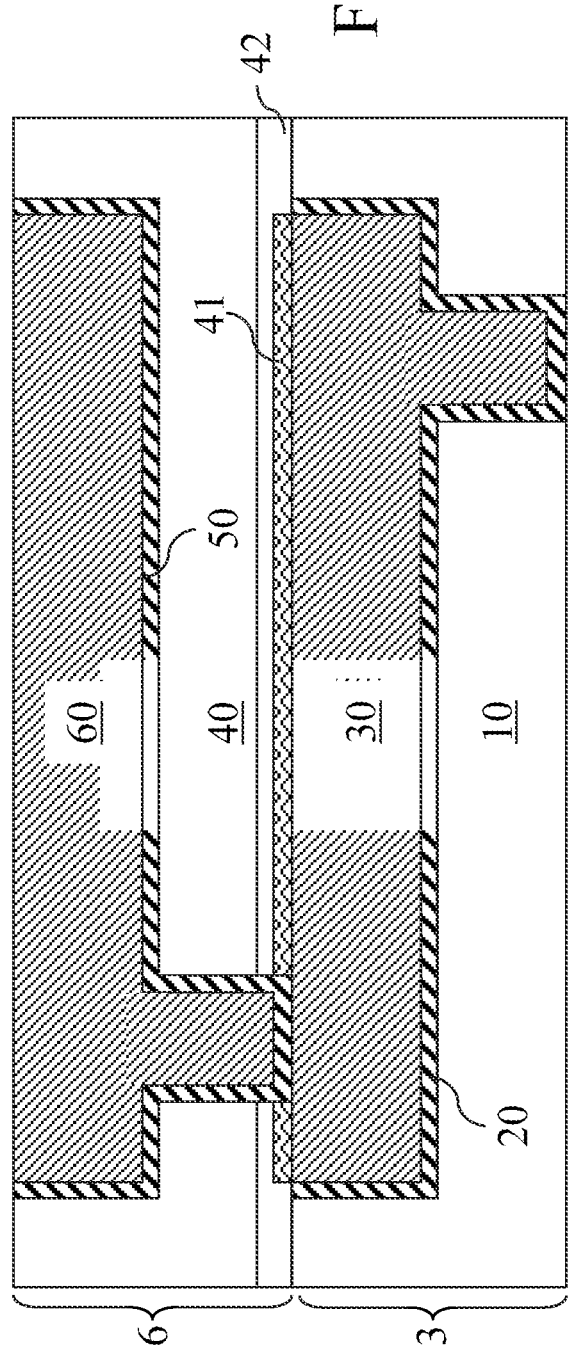
FIGS. 4A and 4B are views of the exemplary metal interconnect structure after formation of a second dielectric material layer and another copper-containing structure according to an embodiment of the present invention.
Figure 4B:
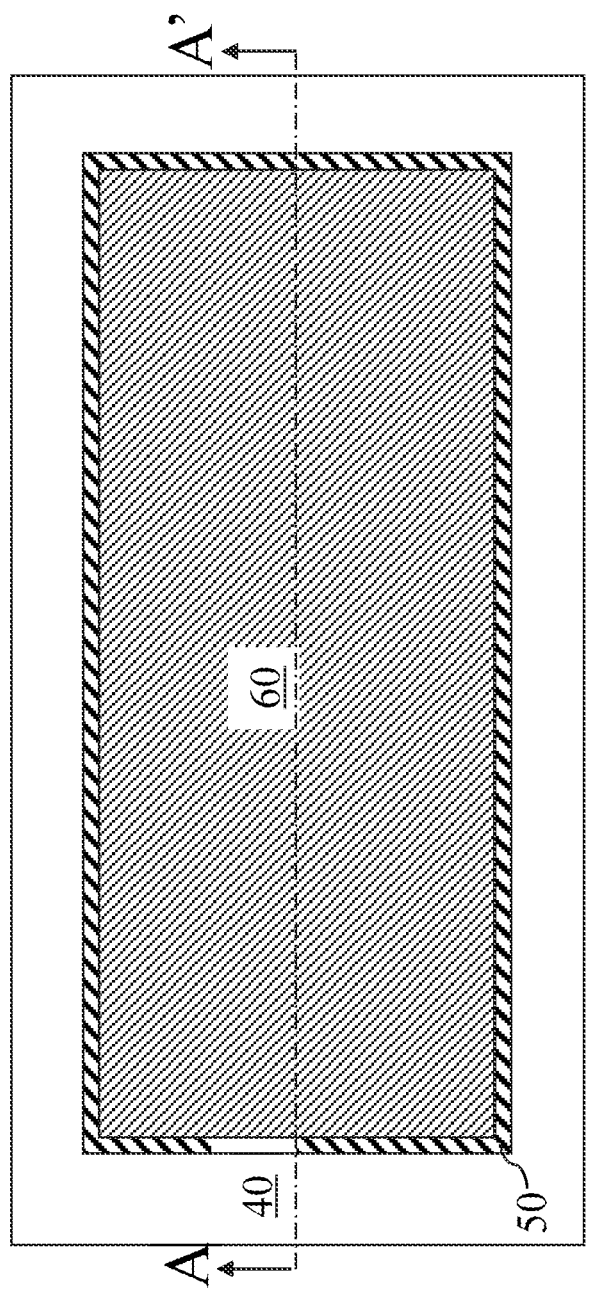

Referring to FIGS. 4A and 4B, an upper level metal interconnect structure 6 is formed by depositing a second dielectric material layer 40, forming a line trench and/or a via cavity in the second dielectric material layer 40 by a combination of lithographic methods and etching, which can be an anisotropic reactive ion etching, formation of a second metallic liner 50 and a second copper-containing structure 60.

The upper level metal interconnect structure 6 can include a second dielectric material layer 40 embedding a second conductive structure, which can include a second metallic liner 50 and a second copper-containing structure 60. The second metallic liner 50 is present between the second dielectric material layer 40 and the second copper-containing structure 60 to promote adhesion of the bottom surface and sidewalls of the second copper-containing structure 60 to the second dielectric material layer 40. The second dielectric material layer 40 is formed on the dielectric cap layer 42, and a bottom surface of the second metallic liner 50 contacts a top surface of the first copper-containing structure 30. The second copper-containing structure 60 can be composed of any material that can be employed for the first copper-containing structure 30. Alternately, the second metallic liner 50 and the second copper-containing structure 60 can be substituted by any other metallic conductive structure that can include Al, Au, Ag, W, Ti, Ta, WN, TiN, TaN, or a combination thereof.

The second dielectric material layer 40 can be any material that may be employed for the first dielectric material layer 10, and can be formed by employing the same methods employed for formation of the first dielectric material layer 40. The thickness of the second dielectric material layer 10 can be from 50 nm to 5,000 nm, although lesser and greater thicknesses can also be employed. Depending on whether a dual damascene integration scheme is employed or a single damascene integration scheme is employed to form the upper level metal interconnect structure 3, the second metallic liner 50 and the second copper-containing structure 60 may constitute a conductive structure in which a conductive metal line and at least one metal via extending downward are integrated, or may constitute only a conductive metal line without any metal via extending downward.

In the exemplary metal interconnect structure, the presence of the monolayer 41 of dielectric materials on the planar upper surface of the first copper-containing structure 30 prevents formation of a copper oxide thereupon. The Cu—S bond between the copper atoms of the first copper-containing structure 30 and the sulfur atoms of the monolayer 41 of dielectric materials provide enhanced adhesion with a greater strength than adhesion provided by a copper oxide layer located between a copper-containing structure and a dielectric cap layer. Thus, the exemplary metal interconnect structure according to an embodiment of the present invention provides enhanced reliability in copper-containing structures against electromigration during usage.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A metal interconnect structure comprising:
a dielectric material layer embedding a copper-containing structure having a planar upper surface; and
a monolayer of dielectric molecules forming a Cu—S bond located on said planar upper surface of said copper-containing structure, wherein said monolayer of dielectric molecules is self-aligned to an area enclosed by a periphery of said planar upper surface of said copper-containing structure, wherein said dielectric molecules are cross-linked by carbon-to-carbon atomic bonds between carbon atoms within neighboring dielectric molecules within said monolayer.

2. The metal interconnect structure of claim 1, wherein each of said dielectric molecules has a formula —S($CH_2$)n-R, wherein n is an positive integer less than 23 and R is an end group selected from an alkyl group, an aminoalkyl group, and a substituted alkyl group.

3. The metal interconnect structure of claim 1, wherein said dielectric molecules cross-linked by atomic bonds between neighboring dielectric molecules within said monolayer.

4. The metal interconnect structure of claim 1, further comprising a metallic liner contacting sidewalls of said copper-containing structure, wherein said copper-containing structure is spaced from said dielectric material layer by said metallic liner, and said monolayer of dielectric molecules does not contact a surface of said metallic liner.

5. The metal interconnect structure of claim 1, wherein each of said dielectric molecules includes an end group selected from an alkyl group, an aminoalkyl group, and a substituted alkyl group, wherein said end group is at an end that is located on an opposite side of said Cu—S bond.

6. The metal interconnect structure of claim 5, wherein each of said dielectric molecules is a molecule including a sulfur atom at one end, at least one substituted or unsubstituted —$CH_2$— group bonded to said sulfur atom, and said end group bonded to said at least one substituted or unsubstituted —$CH_2$— group.

7. The metal interconnect structure of claim 6, wherein each substituted or unsubstituted —$CH_2$— group among said at least one substituted or unsubstituted —$CH_2$— group is independently selected from —$CH_2$—, —CHX—, and —CYZ—, wherein each of X, Y, and Z is independently selected from F, Cl, Br, and I.

8. The metal interconnect structure of claim 6, wherein said at least one substituted or unsubstituted —$CH_2$— group is a single substituted or unsubstituted —$CH_2$— group or a chain of n independent substituted or unsubstituted —$CH_2$— groups, wherein n is an integer from 2 to 22.

9. The metal interconnect structure of claim 8, wherein said at least one substituted or unsubstituted —$CH_2$— group is a chain of n independent substituted or unsubstituted —$CH_2$— groups, wherein n is an integer from 8 to 18.

10. The metal interconnect structure of claim 1, wherein each of said dielectric molecules includes an NHQ group, wherein Q is selected from an alkyl group, an aminoalkyl group, and a substituted alkyl group and said NHQ group is at an end that is located on an opposite side of said Cu—S bond.

11. The metal interconnect structure of claim 10, wherein each of said dielectric molecules is a molecule including a thiophene group at an end including said Cu—S bond, at least one phenyl group bonded to said thiophene group, and said NHQ group bonded to said at least one phenyl group.

12. The metal interconnect structure of claim 11, wherein said at least one phenyl group is a single phenyl group or a chain of n phenyl groups, wherein n is an integer from 2 to 10.

13. The metal interconnect structure of claim 12, wherein said at least one phenyl group is a single phenyl group or a chain of n phenyl groups, wherein n is 2 or 3.

14. The metal interconnect structure of claim 1, further comprising a dielectric cap layer contacting an upper surface of said monolayer of dielectric molecules and an upper surface of said dielectric material layer.

15. The metal interconnect structure of claim 14, wherein said dielectric cap layer comprises Si, C, O, H, or N.

16. A method of manufacturing a metal interconnect structure comprising:
forming a copper-containing structure having a planar upper surface in an upper portion of a dielectric material layer;

applying a solution including dielectric molecules to said planar upper surface, wherein a monolayer of dielectric molecules forming a Cu—S bond is formed on said planar upper surface of said copper-containing structure, and said monolayer of dielectric molecules is self-aligned to an area enclosed by a periphery of said planar upper surface of said copper-containing structure; and cross-linking said dielectric molecules by forming carbon-to-carbon atomic bonds between carbon atoms within neighboring dielectric molecules within said monolayer through plasma treatment.

17. The method of claim 16, wherein each of said dielectric molecules includes an end group selected from an alkyl group, an aminoalkyl group, and a substituted alkyl group, wherein said end group is at an end that is located on an opposite side of said Cu—S bond.

18. The method of claim 17, wherein each of said dielectric molecules is a molecule including a sulfur atom at one end, at least one substituted or unsubstituted —$CH_2$— group bonded to said sulfur atom, and said end group bonded to said at least one substituted or unsubstituted —$CH_2$— group.

19. The method of claim 16, wherein each of said dielectric molecules includes an NHQ group, wherein Q is selected from an alkyl group, an aminoalkyl group, and a substituted alkyl group and said NHQ group is at an end that is located on an opposite side of said Cu—S bond.

20. The method of claim 19, wherein each of said dielectric molecules is a molecule including a thiophene group at an end including said Cu—S bond, at least one phenyl group bonded to said thiophene group, and said NHQ group bonded to said at least one phenyl group.

* * * * *